(12) United States Patent
Utsunomiya

(10) Patent No.: US 7,253,087 B2
(45) Date of Patent: Aug. 7, 2007

(54) METHOD OF PRODUCING THIN-FILM DEVICE, ELECTRO-OPTICAL DEVICE, AND ELECTRONIC APPARATUS

(75) Inventor: Sumio Utsunomiya, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/849,890

(22) Filed: May 21, 2004

(65) Prior Publication Data

US 2004/0266165 A1 Dec. 30, 2004

(30) Foreign Application Priority Data

May 23, 2003 (JP) ............................. 2003-146165

(51) Int. Cl.
*H01L 21/4763* (2006.01)
*H01L 21/44* (2006.01)

(52) U.S. Cl. ........................................ 438/598; 438/617

(58) Field of Classification Search ................ 438/118, 438/135, 149–155, 455–459, 940, 977, 73, 438/461, 598, 617; 257/203, 250
See application file for complete search history.

(56) References Cited

U.S. PATENT DOCUMENTS

| | | | |
|---|---|---|---|
| 6,365,483 B1 * | 4/2002 | Lin et al. ...................... | 438/384 |
| 6,372,608 B1 | 4/2002 | Shimoda et al. | |
| 6,610,552 B2 * | 8/2003 | Fujimori et al. ............... | 438/22 |
| 6,627,518 B1 | 9/2003 | Inoue et al. | |
| 6,846,703 B2 | 1/2005 | Shimoda et al. | |
| 6,887,650 B2 | 5/2005 | Shimoda et al. | |
| 2002/0016031 A1 | 2/2002 | Fujimori et al. | |
| 2003/0008437 A1 * | 1/2003 | Inoue et al. .................. | 438/149 |
| 2003/0217805 A1 * | 11/2003 | Takayama et al. .......... | 156/249 |
| 2004/0137658 A1 * | 7/2004 | Aratani et al. ................ | 438/48 |
| 2005/0146266 A1 * | 7/2005 | Kuma et al. ................. | 313/506 |

FOREIGN PATENT DOCUMENTS

| | | |
|---|---|---|
| CN | 1256791 A | 6/2000 |
| JP | A-08-278519 | 10/1996 |
| JP | A-10-12529 | 1/1998 |
| JP | A-10-12530 | 1/1998 |
| JP | A-10-12531 | 1/1998 |
| JP | A-11-074533 | 3/1999 |
| JP | A-11-251518 | 9/1999 |
| JP | A-2000-133809 | 5/2000 |
| JP | A 2000-262972 | 9/2000 |
| JP | A-2001-51296 | 2/2001 |
| JP | A-2001-166301 | 6/2001 |
| JP | A-2001-341296 | 12/2001 |
| JP | A-2002-222695 | 8/2002 |
| WO | WO 03/010825 | 2/2003 |

* cited by examiner

*Primary Examiner*—Calvin Lee
(74) *Attorney, Agent, or Firm*—Oliff & Berridge, PLC

(57) ABSTRACT

The invention provides a transfer technique by which the dimensional precision of a thin-film device is not deteriorated, even if the device is produced by transferring a fine structure or a thin-film circuit layer onto a substrate with an inferior shape-stability. The method includes: forming a fine structure or a thin-film circuit layer on a first substrate using a photolithographic patterning process; shifting the fine structure or the thin-film circuit layer from the first substrate onto a second substrate, or shifting the fine structure or the thin-film circuit layer from the first substrate onto the second substrate via a third substrate; and forming a thin-film pattern on the fine structure or the thin-film circuit layer shifted onto the second substrate by a non-photolithographic method.

10 Claims, 10 Drawing Sheets

LIGHT IRRADIATION

LIGHT IRRADIATION

METHOD OF PRODUCING THIN-FILM DEVICE, ELECTRO-OPTICAL DEVICE, AND ELECTRONIC APPARATUS

This application claims priority from Japan Patent Application No. 2003-146165, filed on May 23, 2003, the entire contents of which are hereby incorporated by reference.

BACKGROUND OF THE INVENTION

1. Field of Invention

The present invention relates to a method of producing a thin-film device using a transferring technique by which a thin-film circuit layer or a fine structure formed on an element-formation substrate is transferred onto another substrate.

2. Description of Related Art

For related art devices, such as liquid-crystal displays (LCD), organic EL displays, etc., it may be desirable to use a plastic substrate as a base so that the devices are prevented from being broken when they are deformed or dropped, or so that the cost of the devices is reduced.

However, manufacturing thin-film transistors for use in a panel display device, etc., includes a process which is carried out at a relatively high temperature. Thus, problems occur in that plastic substrates or circuit elements, such as organic EL elements, cannot be used in the above-mentioned process.

The Applicant of the present invention invented a related art transfer technique for producing a thin-film device, by which a semiconductor device is formed on a heat resistant substrate by a semiconductor manufacturing technique including a high temperature semiconductor process, and an element-formation layer having the semiconductor device formed therein is released, and then bonded to a plastic substrate. For example, such release and transfer techniques are disclosed in Japanese Unexamined Patent Application Publication No. 10-12529, Japanese Unexamined Patent Application Publication No. 10-12530, and Japanese Unexamined Patent Application Publication No. 10-12531. Thus, the formation of a thin-film device is realized by transferring, to a plastic substrate, a thin-film circuit layer of a thin-film transistor, etc., produced in a high temperature process using the above-described release-transfer technique.

SUMMARY OF THE INVENTION

However, after the thin-film circuit layer is transferred onto the plastic substrate, film-formation on the plastic substrate, such as formation of a wiring, wiring connections, addition of an external circuit, formation of a protecting film, etc., is also required for the completion of the thin-film device. However, plastic substrates have disadvantages in that the shape-stabilities are inferior. In particular, the plastic substrates are stretched or contracted due to the heat-expansion and/or heat shrinkage and the absorption and/or release of water contained therein during the process for fabricating the thin-film device. Moreover, the plastic substrates are low in mechanical strength, and therefore are ready to be distorted during the process. Thus, it is difficult to additionally process the patterns of the thin-film circuit layers which are transferred on the plastic substrates, securing high dimensional precision.

The present invention provides a transfer technique by which a thin-film circuit layer transferred on a plastic substrate is additionally processed, whereby a thin-film device having a proper function is produced without deterioration of the dimensional precision of the thin-film device.

To address or achieve the above, the method of producing a thin-film device of the present invention includes: forming a fine structure or a thin-film circuit layer on a first substrate using a photolithographic patterning process; performing at least one of transferring the fine structure or the thin-film circuit layer from the first substrate onto a second substrate, and transferring the fine structure or the thin-film circuit layer from the first substrate onto the second substrate via a third substrate; and additionally processing the fine structure or the thin-film circuit layer transferred on the second substrate by a non-photolithographic method.

According to the above-described constitution, the transferring the fine structure or the thin-film circuit layer is carried out after all of the photolithographic processes are completed, and the additional process with respect to the transferred thin-film circuit layer is conducted by a liquid-drop jetting method (ink jet method), a printing method, a mask-evaporation method, a bonding method accompanied by a positioning process, etc. Therefore, even if the final transfer substrate (second substrate) has an inferior shape-stability which is due to the thermal expansion and the flexibility such as of plastics, the patterning precision and the positioning precision can be prevented from lowering.

Referring to the photolithography applied for the production of the thin-film circuit layer including the fine-structure, the dimensional precision and the positioning precision of not more than 1 μm are required. Even if a plastic substrate the length of one side of which is, e.g., 50 cm, expands by only 10 ppm (0.01%), the dimensional change of the whole substrate amounts to 5 μm. The change-amount exceeds the dimensional precision required for the photolithographic method. Thus, it is difficult to carry out the photolithographic method on a plastic substrate.

Therefore, the forming the fine structure of the thin-film circuit layer is completed on a hard substrate, such as a glass substrate, a quartz substrate, etc. Thereafter, the thin-film circuit layer is transferred onto a plastic substrate, and then the thin-film circuit layer is additionally processed, using a method not requiring a high dimensional precision (a liquid-drop jetting method (ink jet method), a printing method, a mask-evaporation method, a bonding method accompanied by a positioning process, etc.) Thus, a thin-film device having a proper function can be produced.

For example, in the case where the above-described production process is applied to an organic EL display device, the photolithographic processes ranging from the formation of the undercoat layer to the formation of a bank layer which separates neighboring organic EL emission elements from each other is carried out on the first substrate (glass substrate). Thus, the process of forming the thin-film circuit layer to be transferred is completed. After the thin-film circuit layer is transferred onto the second substrate (plastic substrate), the film-formation of the organic EL emission layer is carried out by a liquid-drop jetting method. Thus, the organic EL emission layer can be formed on the thin-film circuit layer at a required precision.

Preferably, the first substrate is a hard substrate made of quartz glass, alkali glass, etc., and the second substrate is a soft or flexible substrate, such as plastics, etc. Thereby, the processes, such as the formation of the thin-film circuit requiring a high precision for the patterning, is carried out on the hard substrate at a high precision.

Preferably, the non-photolithographic method includes at least one of a liquid-drop jetting method, a printing method, a mask-evaporation method, and a bonding method accompanied by a positioning process. According to the liquid-drop jetting method, no mask is used. Thus, positioning of the mask is unnecessary. Accordingly, even if the plastic substrate thermally expands, so that the substrate pattern and the mask pattern do not match each other, the formation of a pattern can be performed. According to the printing method, the mask-evaporation method, the bonding method accompanied by a positioning process, or the like, positioning of a mask is necessary. However, in the case where the dimensional precision and the positioning precision required for the formation of a pattern are high compared to the deformation-amount of the plastic substrate, rejection of the thin-film device as a final product, caused by errors in the size and the positioning, can be avoided.

Preferably, transferring the fine structure or the thin-film circuit layer from the first substrate to the second substrate includes: applying an energy to a release layer arranged between the first substrate and the fine structure or the thin-film circuit layer after the first substrate and the second substrate are bonded to each other, to thereby cause the release; or removing the first substrate from the first and second substrates bonded to each other using etching or abrading. In the case where the first substrate is released, the first substrate can be re-used. Thus, advantageously, an expensive substrate, such as a quartz glass sheet, can be repeatedly used. However, this is not restrictive. The first substrate may be excluded by abrading, etching, etc.

The electro-optical device and the electronic apparatus of the present invention include the thin-film devices produced according to the above-described production method. The thin-film device, etc., produced according to the production method of the present invention, even if the final substrate is a plastic substrate, is provided with the fine structure or the thin-film circuit layer with a relatively high precision.

Regarding the thin-film device, a thin-film material is formed into a film using a semiconductor manufacturing technique, and thus the function of the device is realized. Typically, the thin-film device is a thin-film electric circuit. Moreover, the thin-film device includes a fine structure, such as a vibrator, an actuator, an optical element, etc., which is fine-processed by a semiconductor manufacturing technique. Generally, the electro-optical device means a device provided with an electro-optical element which emits light or changes the state of light applied from the outside due to the electrical action of the device, and includes a device itself that emits light and a device which controls the transmission of light applied from the exterior. The electro-optical element may be a liquid crystal element, and an electrophoretic element containing a dispersion medium in which electrophoretic particles are dispersed, an EL (electroluminescence) element, an electron-emission element in which an electron emitted by application of an electric field is bombarded against a light-emission plate so that light is emitted, for example. Display devices, etc., provided with these elements are examples of the electro-optical device.

The electronic apparatus contains as a display, etc., the thin-film device or the electro-optical device. The electronic apparatus may be a video-camera, a television, a large-screen, a portable telephone, a personal computer, a portable type information apparatus (so-called PDA (personal digital assistance)), and devices, for example.

DETAILED DESCRIPTION OF PREFERRED EMBODIMENTS

First Exemplary Embodiment

An exemplary embodiment of the present invention is described below with reference to the drawings. According to the exemplary embodiment of the present invention, a functional element, such as a fine structure, a thin-film circuit, etc., is formed on a first substrate made of quartz glass, alkali glass, etc. The functional element is shifted onto a second substrate by the transfer method described above. In the formation of the functional element on the first substrate, the film-patterning is carried out by photolithography. On the other hand, film-patterning on the second substrate is not carried out by the photography. Film-patterning required after the transferring is carried out by a technique not using mask-alignment, such as a liquid-drop jetting method. Thus, it is desirable to carry out the film-patterning on only the first substrate.

For example, in the case in which the thin-film device is an organic EL display device, the process from the first step to the step of forming walls (bank) partitioning pixels from each other is carried out on the first substrate. Then, the functional element is transferred onto the second substrate (plastic substrate). Details of the structure and the function of the banks used in the organic EL display device are described in Japanese Unexamined Patent Application Publication No. 2001-341296, Japanese Unexamined Patent Application Publication No. 2002-222695, etc.

FIGS. 1A to 3D are schematics showing the process of producing an organic EL display device as an electro-optical device using a method of transferring a thin-film structure.

Figure 1A:
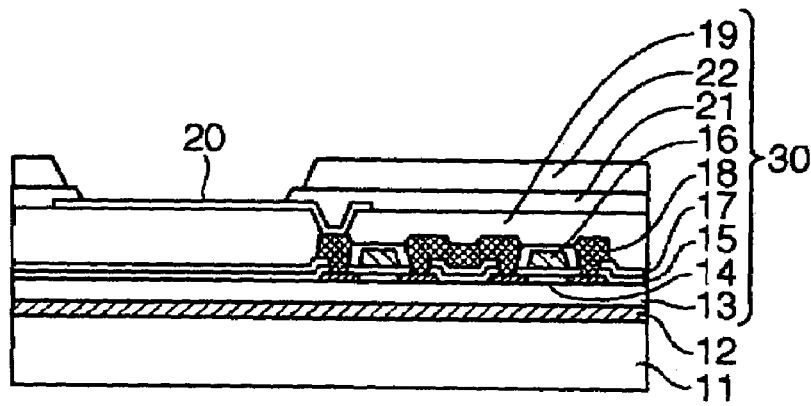
FIGS. 1A–1D are schematics showing the process of producing an organic EL display according to an exemplary embodiment of the present invention.

First, as shown in FIG. 1A, amorphous silicon (α-Si) 12 is formed into a film on a transparent glass substrate 11 as a first substrate by CVD (Chemical Vapor Deposition). The formed film functions as a release layer.

Release occurs in the release layer or in the interface thereof (referred to as "in-layer release" or "interface release") by irradiation with a light beam, such as the laser beam described below. In particular, when the release layer is irradiated with a light-beam with a predetermined intensity, the bonding forces between atoms and those between molecules, the atoms and the molecules forming a component material of the release layer, become zero or are reduced. That is, ablation or the like occurs, which causes the release. In some cases, gas is generated in the release layer by irradiation with a light-beam, and thus separation occurs in the layer. Also, in some cases, a component contained in the release layer becomes gas, so that separation occurs in the release layer, or the release layer absorbs a light-beam to become gas with the vapor being discharged, which leads to the separation. Referring to the composition of the release layer, the use of amorphous silicon (a-Si) is preferable. However, the composition is not restricted to the amorphous silicon.

The amorphous silicon may contain hydrogen. Preferably, the content of hydrogen is not less than about 2 atomic percent, more preferably in the range of 2 to 20 atomic percent. When the amorphous silicon contains hydrogen, the hydrogen is discharged by irradiation with a light beam, so that an inner pressure is caused in the release layer. The inner pressure promotes the release. For example, in the case where the CVD method is used, the content of hydrogen is adjusted by employing appropriate film-forming conditions, such as gas-composition, gas-pressure, gas-atmosphere, a gas flow rate, gas-temperature, substrate-temperature, the power of a light beam applied, etc.

A silicon dioxide layer ($SiO_2$) 13 is formed as an insulating layer on the amorphous silicon 12. Subsequently, a silicon layer 14 is formed in a film-shape as a semiconductor layer on the silicon dioxide layer 13 which serves as an undercoat layer by a CVD method. The silicon layer 14 is heat-treated by an excimer laser, etc., so as to be polycrystallized. The polysilicon layer may be formed in a film-shape by a plasma CVD method. The silicon layer 14 is patterned by a photo-etching method. Thus, an activated area is formed in which a thin-film transistor is to be formed.

A silicon dioxide layer 15 is formed as a gate insulating film on the silicon layer 14 by a CVD method. A silicon layer containing an impurity at a high concentration is formed in a film-shape by a CVD method on the silicon dioxide layer 15. The silicon layer is patterned by a photo-etching method to form a gate electrode and a wiring 16. Impurities are implanted into the source drain area of the thin-film transistor by an ion implantation method using the gate electrode 16 as a mask. The impurities are activated by heat-treatment. A silicon oxide layer 17 is formed in a film-shape as an interlayer insulating film on the silicon dioxide layer 15, the gate electrode and the wiring 16 by a CVD method.

A contact-hole is formed in the silicon oxide film 17 on the source•drain area of the thin-film transistor. A metal layer of aluminum, etc., or a polysilicon layer is formed in a film-shape as a source•drain electrode and a wiring, and the film is patterned by photo-etching. Thus, a source•drain electrode and a wiring 18 are formed.

Moreover, a silicon dioxide layer 19 is formed in a film-shape as a protecting layer on the source•drain electrode, the wiring 18, etc., by a CVD method. Subsequently, an opening is formed in the silicon dioxide 19 on the drain electrode by a photo-etching method. A transparent electrode layer, such as ITO, etc., is formed in a film-shape thereon, and is patterned by a photo-etching method, whereby the lower electrode layer 20 of the organic EL emission layer is formed. Furthermore, a silicon dioxide layer 21 is formed in a film-shape thereon. An opening is formed in the lower electrode layer (ITO) 20 by a photo-etching method. Moreover, a photo-sensitive resin 22 is coated to form bank layers which separate pixel areas. The lower electrode 20 is exposed in a pattern, and developed so that an opening is formed in the lower electrode 20. The layers ranging from the undercoat insulating layer 13 to the bank layer 22 form a thin-film circuit layer 30.

Then, according to this exemplary embodiment of the present invention, the thin-film circuit layer 30 is transferred. In the case of another thin-film device, a fine structure may be solely formed, or the fine structure may be formed together with the thin-film circuit layer. As described above, the fine structure may include a piezoelectric vibrator, an electrostatic vibrator, an actuator, a diffraction grating, a micromirror, a microlens, an optical element, a prove structure for use with living body samples and DNA samples, etc., for example.

Figure 1B:
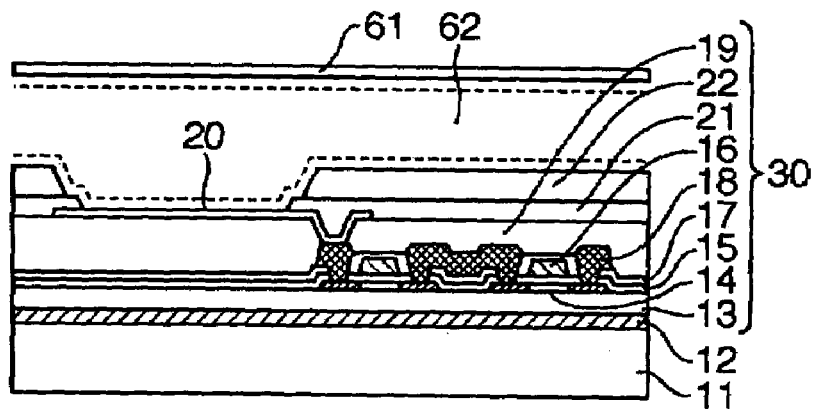
Figure 1C:
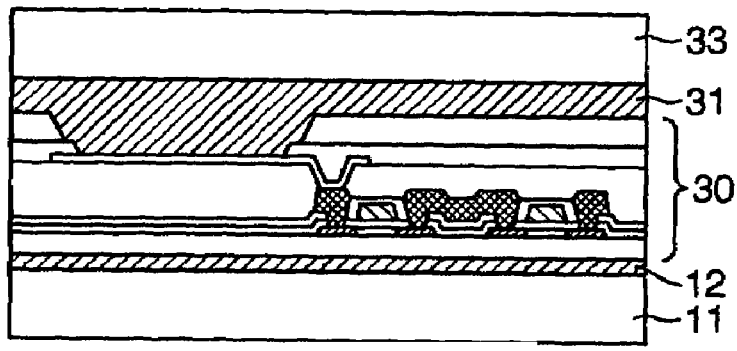

Subsequently, as shown in FIG. 1B, the surface of the substrate is processed so as to have a liquid-philic property. For example, the substrate 11 having the thin-film circuit layer 30 formed thereon is set in a plasma-etching device. Oxygen plasma ($O_2^+$) or Argon plasma ($Ar^+$) are generated between an opposed electrode 61 and the upper surface of the substrate 11. Thus, the upper surface of the substrate 11 is exposed to the plasma 62, so that the surface is roughened. Thereby, the surfaces of the bank layer 22 and the lower electrode 20 have a liquid-philic property.

Then, a water-soluble adhesive 31 is evenly coated as a temporary adhesive layer on the bank layer 22 of the first substrate. A temporary transfer substrate 33, which is a third substrate, is bonded. Since the surfaces of the bank layer 22 and the lower electrode 20 are treated so as to have a liquid-philic property, the thin-film circuit layer 30 on the upper side of the substrate 11 strongly bonds to the adhesive layer 31 (see FIG. 1C).

Figure 1D:
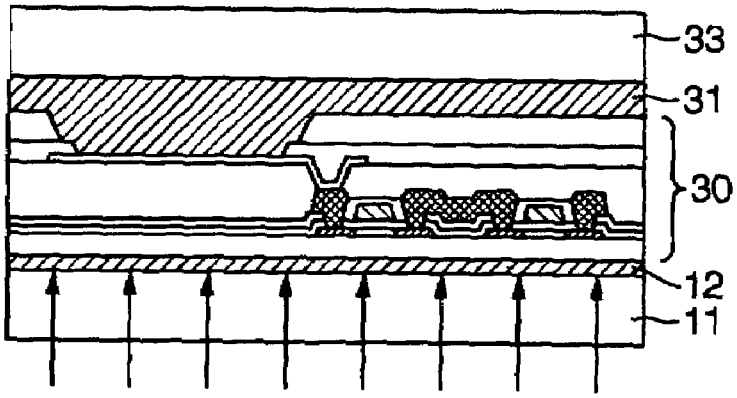

The amorphous silicon layer 12 is irradiated with an excimer laser beam via the transparent glass substrate 11 from the lower side. Thus, ablation is caused in the release layer, so that release occurs in the layer (FIG. 1D). The glass substrate 11 is peeled off and separated. Thereby, the thin-film circuit layer 30 is transferred (shifted) from the glass substrate 11 side to the temporary transfer substrate 33 side. The part of the release layer 12 remaining on the lower side of the thin-film circuit layer 30 is removed by etching.

Figure 2A:
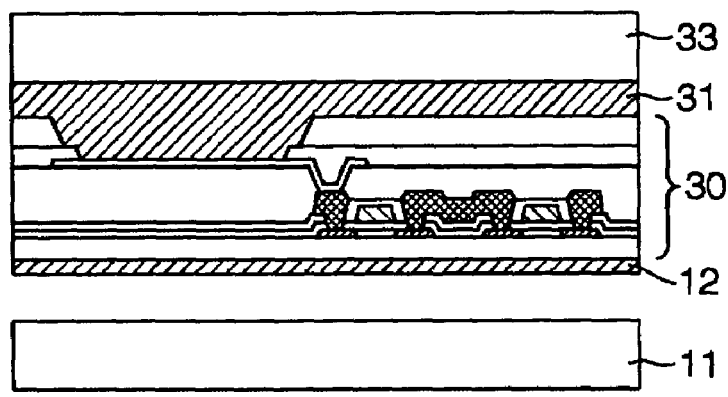
FIGS. 2A–2D are schematics showing the process of producing the organic EL display according to the exemplary embodiment of the present invention.

By carrying out the above-described treatment to render a liquid-philic property to the substrate, the bonding strength in the interface between the adhesive layer 31 and the thin-film circuit layer 30 can be made higher than the force with which the substrate 11 is peeled off. Thus, the adhesive layer 31 can be prevented from being released, when the substrate 11 is peeled off (FIG. 2A).

Figure 2B:
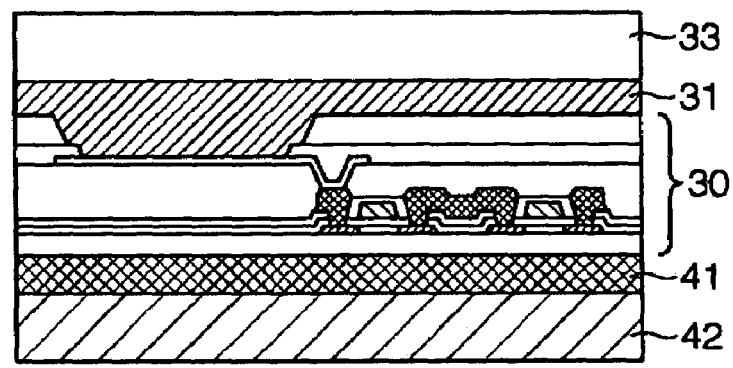
Figure 2C:
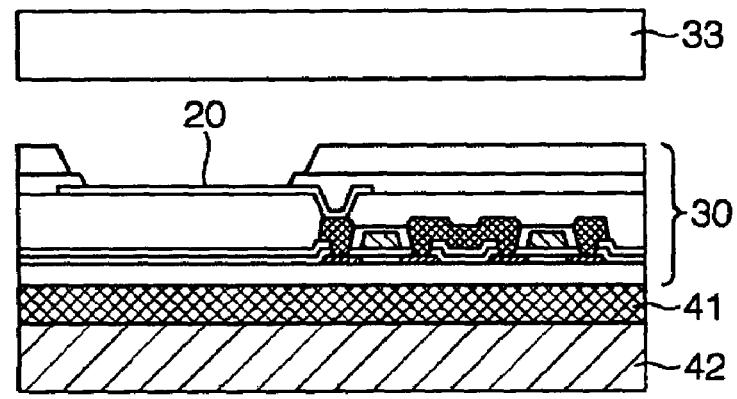
Figure 2D:
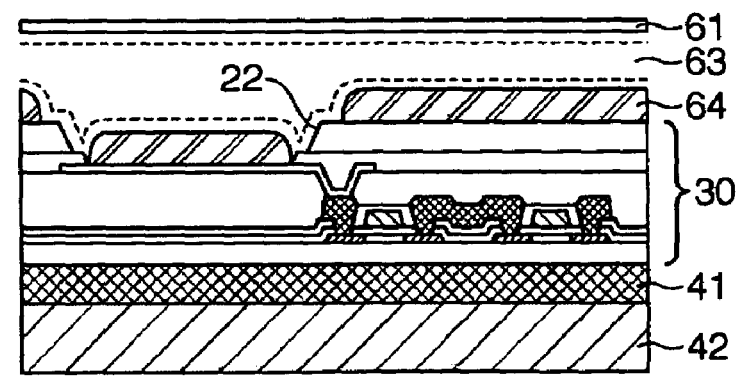

A water-insoluble type permanent adhesive 41 is coated onto the lower side of the thin-film circuit layer 30, and is bonded to a final transfer substrate 42 which is the second substrate. For example, the final transfer substrate 42 is a plastic substrate (FIG. 2B). The water-soluble adhesive 31 is removed by rinsing. Thus, the temporary transfer substrate 33 is separated. The thin-film circuit layer 30 is re-transferred (shifted) onto the final transfer substrate 42 (FIG. 2C).

Figure 3A:
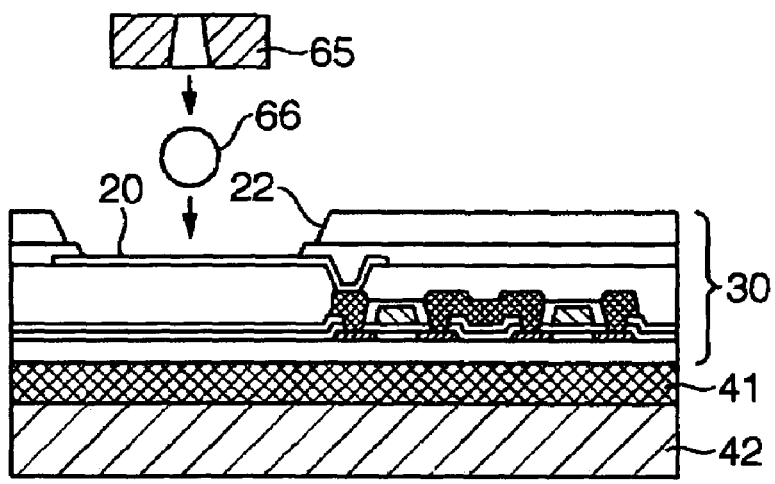
FIGS. 3A–3D are schematics showing the process of producing the organic EL display according to the exemplary embodiment of the present invention.

Subsequently, to enhance the precision with which a light-emission layer is formed, the substrate is treated so as to have a water-repelling property. For example, the part of the substrate from which the bank layer 22 is removed so that the part is exposed, is set into a plasma-etching device, and thus fluorine-plasma ($F^+$) is generated on the surface of the substrate, and the slant surface of the bank layer 22 is exposed to the plasma 63 to be smoothened. Thereafter, as shown in FIGS. 3A–3D, a light emission layer is formed. An organic EL material 66 is jetted on the lower electrode 20 to be pixels through the nozzle 65 of a liquid-drop jetting head (not shown), so that a coating pattern is formed, and thus the light-emission layer is formed. As described above, the surface of the lower electrode is treated so as to have a liquid-philic property, and the slant surface (wall) of the bank layer 22 is treated to have a liquid-repellent property. Thus, the organic EL material jetted toward the light emission element area including the slant surface can be conveniently introduced onto the lower electrode 20, and thus is formed in a film-shape (FIG. 3A).

Figure 3B:
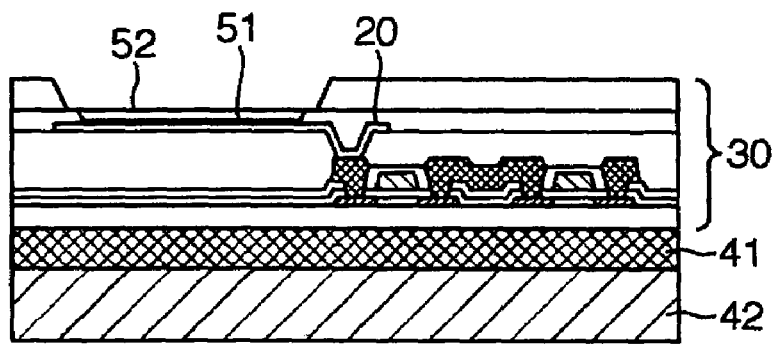
Figure 3C:
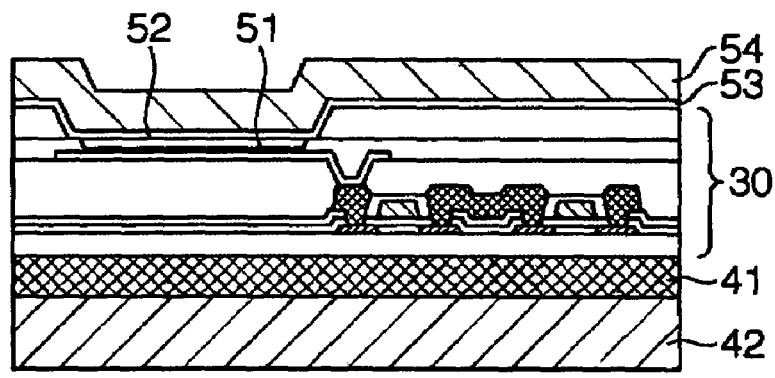

Film materials for formation of a hole-transport layer 51 and an EL emission layer 52, which are to form a light emission layer, are sequentially coated in a film-shape onto the lower electrode 20 through the liquid-drop jetting head (FIG. 3B). For example, a calcium layer 53 is formed as an electron-transport layer, and an aluminum layer 54 is formed in a film-shape as a cathode by sputtering, vacuum-evaporation, etc., (FIG. 3C).

Figure 3D:
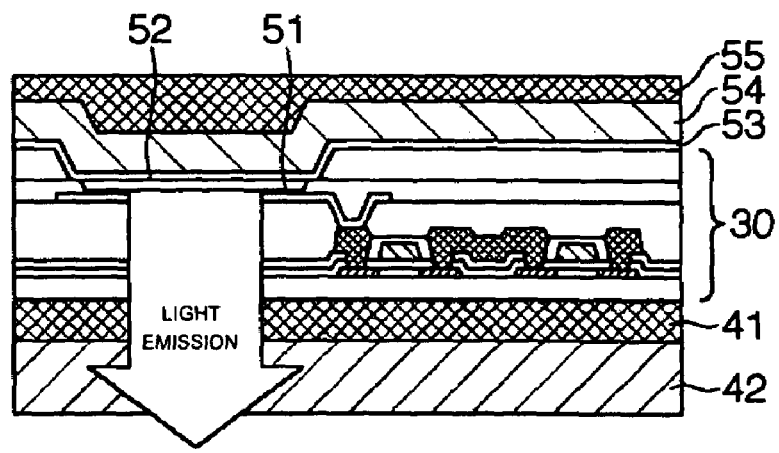

A sealing layer 55 is coated as a protecting layer onto the uppermost part. Thus, the organic EL display device (thin-film device) is attained. In the example shown in FIGS. 3A–3D, an organic EL emission element is formed, which emits light downward (FIG. 3D).

The above-described treatment to render a liquid-philic property (FIG. 1A) and that to render a water-repelling property (FIG. 1B) is not necessarily carried out. The treatment is advantageous in that the adhesive layer 31 is suppressed or prevented from peeling off in the releasing process, the precision at which the light-emission element is formed is enhanced, and so forth.

According to the above-described manufacturing process for the thin-film circuit (organic EL display device), photo-etching requiring a high patterning precision is not carried out after the thin-film circuit layer 30 is temporarily transferred onto the final transfer substrate 42 (see FIG. 2C). Therefore, even if a substrate with an inferior shape-stability, such as a plastic substrate, etc., is used, a pattern with a high dimensional stability can be formed without problems.

Second Exemplary Embodiment

The second exemplary embodiment is described below with reference to FIGS. 4A to 5D. The elements in these drawings corresponding to those in FIGS. 1A to 1D and FIGS. 2A to 2D are represented by the same reference numerals, and their descriptions are not repeated.

According to the second exemplary embodiment, the above-described liquid-repelling treatment of the bank layer 22 (FIG. 2D) is not carried out, but the bank layer 22 itself is formed in a film-shape by use of a material having a liquid-repelling property. Thus, the bond of the bank layer 22 to the adhesive layer 31 may become insufficient. Accordingly, an intermediate layer 23 is formed between the bank layer 22 and the adhesive layer 31. A required bonding force between the bank layer 22 and the adhesive layer 31 is secured by the intermediate layer 23. The intermediate layer 23 is removed after the thin-film circuit layer 30 is transferred onto the final substrate. The light-emission area is treated so as to have a liquid-philic property, if necessary. Thereafter, the organic EL material is formed in a film-shape by a liquid-drop jetting method similar to that shown in FIGS. 3A–3D.

Figure 4A:
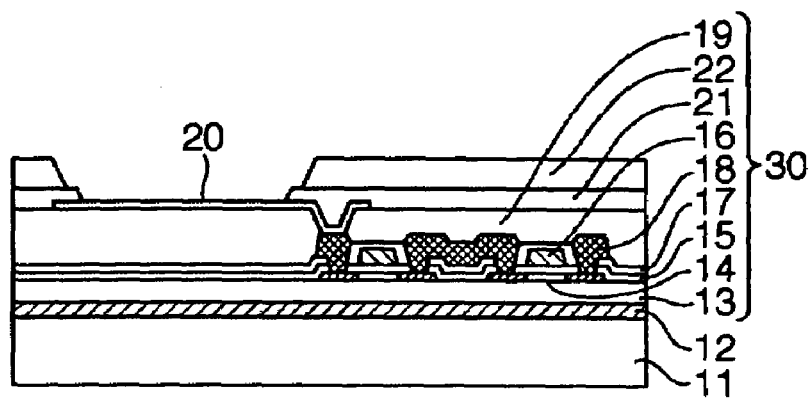
FIGS. 4A–4D are schematics showing the process of producing an organic EL display according to a second exemplary embodiment of the present invention.
Figure 4B:
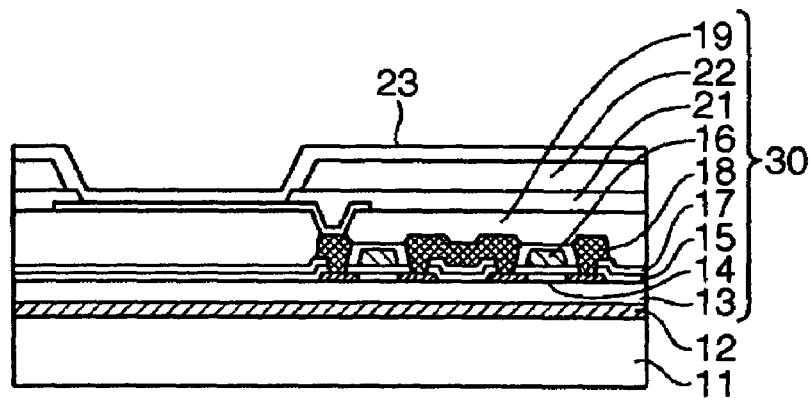

First, as shown in FIGS. 4A–4D, the thin-film circuit layer 30 is formed on the transparent substrate 11, which is the first substrate, via the release layer 12. The bank layer 22 is formed in a film-shape with a material having a liquid-repelling property as described above (FIG. 4A). Subsequently, the intermediate layer 23 is formed in a film-shape on the surface side of the substrate. For example, the intermediate layer 23 may be formed with an inorganic material, i.e., silicon oxide ($SiO_2$), an organic polymer containing polysilazane ($SiH_2NH$) as units, or the like. For example, silicon oxide may be formed in a film-shape by a CVD method, etc. (FIG. 4B).

Figure 4C:
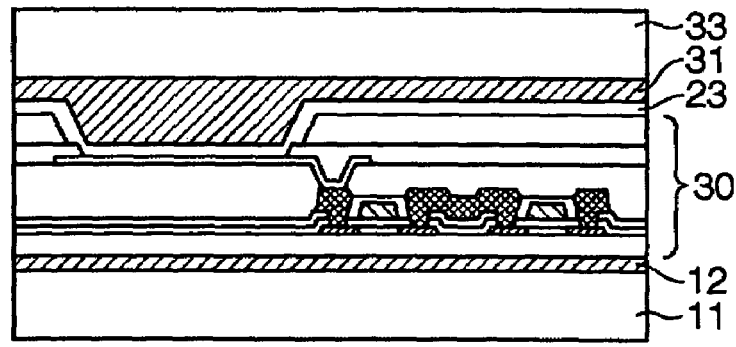

Then, the water-soluble adhesive layer 31 is evenly coated as a temporary adhesive layer onto the intermediate layer 23. The temporary transfer substrate 33, which is a third substrate, is bonded thereto. Although the bank layer 22 has a liquid-repelling property, the adhesive layer 31 has a required bonding force (adhesion force) due to the presence of the intermediate layer 23 (FIG. 4C.)

Figure 4D:
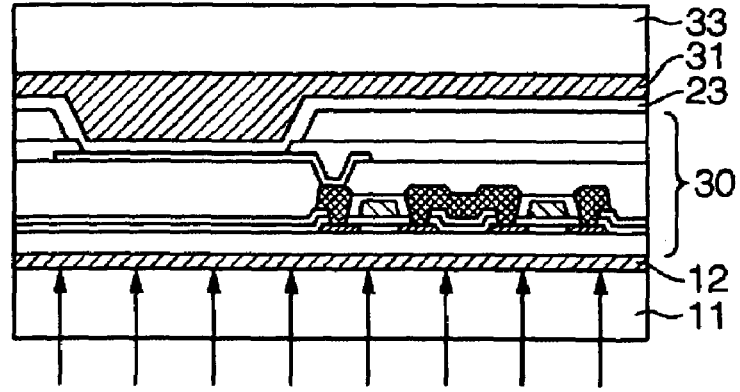

The amorphous silicon layer 12, which is a release layer, is irradiated with an excimer laser beam via the transparent substrate 11 from the lower side. Thus, the ablation occurs, resulting in the releasing (FIG. 4D). Then, the glass substrate 11 is peeled off and separated. Thereby, the thin-film circuit layer 30 is transferred (shifted) from the glass substrate 11 side to the temporary transfer substrate 33 side. The part of the release layer 12 remaining on the lower side of the thin-film circuit layer 30 is removed by etching.

Figure 5A:
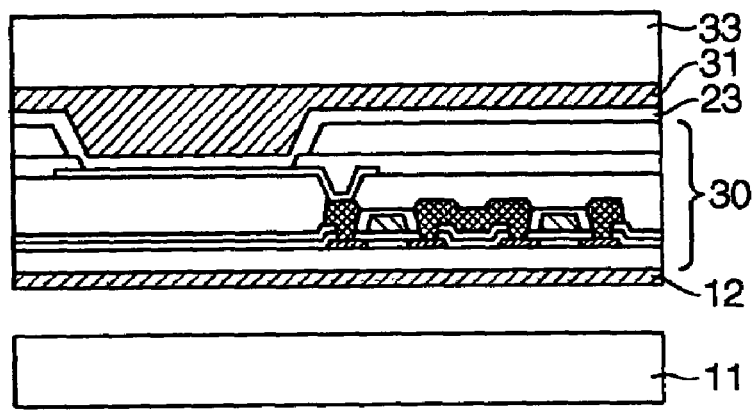
FIGS. 5A–5D are schematics showing the process of producing the organic EL display according to the second exemplary embodiment of the present invention.

By carrying out the above-described treatment to render a liquid-philic property to the substrate, the bonding strength at the interface between the adhesive layer 31 and the thin-film circuit layer 30 can be increased to be higher than the force required for peeling off of the substrate 11. Thus, the release can be prevented from occurring in the adhesive layer 31 when the substrate is peeled off (FIG. 5A).

Figure 5B:
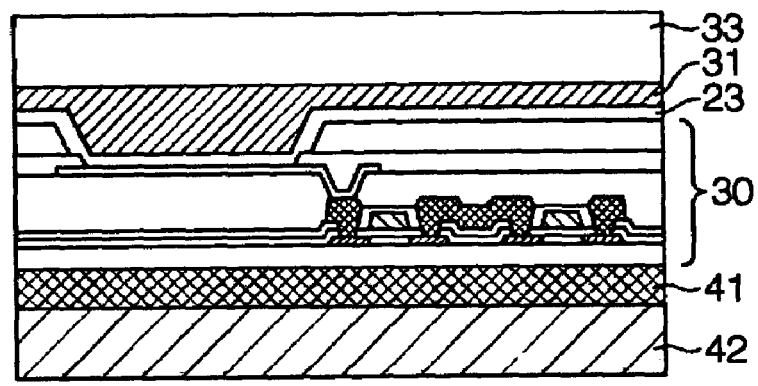
Figure 5C:
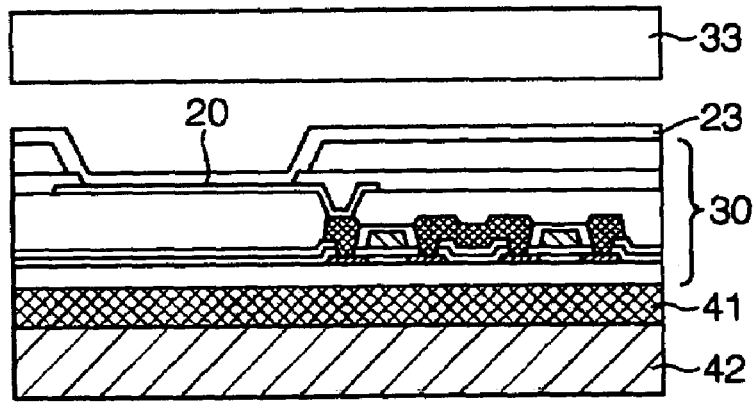

The water-insoluble permanent-type adhesive 41 is coated onto the lower side of the thin-film circuit layer 30, and is bonded to the final transfer substrate 42 which is a second substrate. For example, the final transfer substrate 42 is a plastic substrate (FIG. 5B). The water-soluble adhesive layer 31 is removed by rinsing. Thus, the temporary transfer substrate 33 is separated. The thin-film circuit layer 30 is re-transferred (shifted) onto the final transfer substrate 42 (FIG. 5C).

Figure 5D:
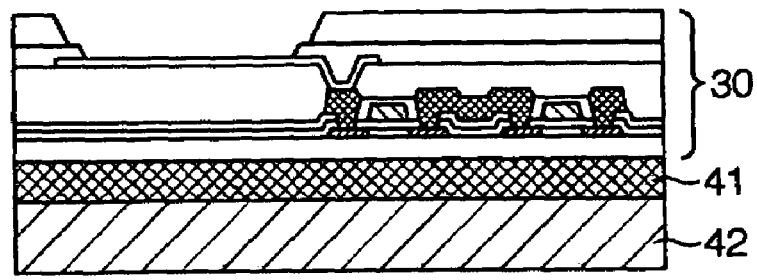

Subsequently, the intermediate layer 23 is removed by etching (FIG. 5D). The light-emission element area is treated so as to have a liquid-philic property, if necessary (see FIG. 1B). Thereafter, the same procedures as those shown in FIGS. 3A–3D are carried out to form a light-emission layer. Thus, an organic EL display is formed. In this exemplary embodiment, the bank layer 22 itself has a liquid-repelling property.

Third Exemplary Embodiment

The third exemplary embodiment is described below with reference to FIGS. 6A–6E. In FIGS. 6A–6E, elements equivalent to those in FIG. 2C are represented by the same reference numerals. Descriptions of the equivalent elements are not repeated.

According to the third exemplary embodiment, an organic EL display device is produced by a mask-evaporation method instead of the liquid-drop jetting method used in the first exemplary embodiment. The thin-film circuit layer 30 including a fine structure is formed on the first substrate by photolithography, and is transferred onto the second exemplary embodiment, similarly to the first exemplary embodiment.

Figure 6A:
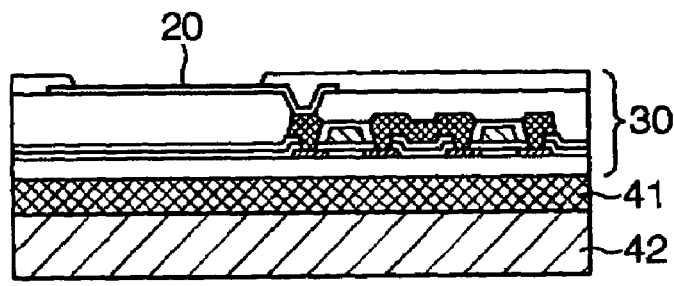
FIGS. 6A–6E are schematics illustrating a third exemplary embodiment.

In the case where the organic EL display is produced by the mask-evaporation method, the bank 22 described in the first exemplary embodiment is not necessary. Thus, the thin-film circuit layer 30 formed by the process of the first step to the opening in the pixel area is transferred (FIG. 6A).

Figure 6B:
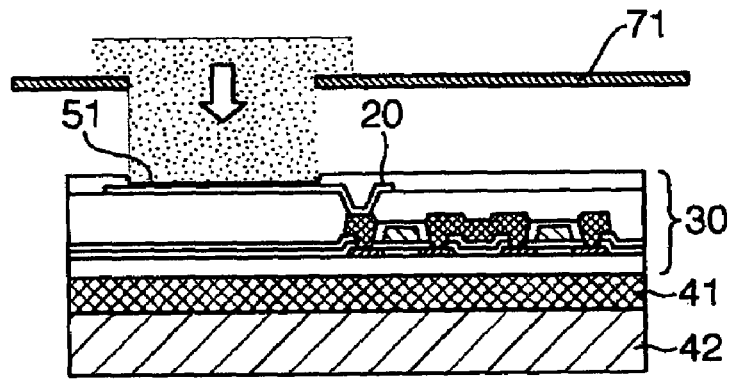
Figure 6C:
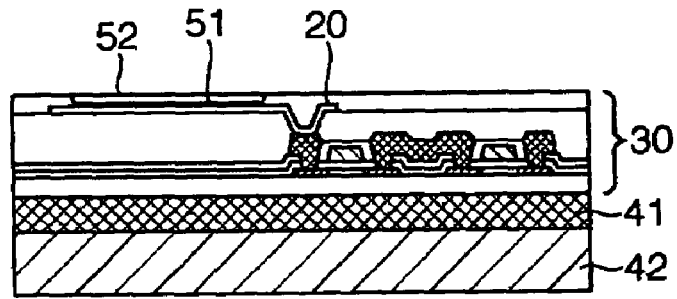

Then, an organic El material is vapor-deposited on the lower electrode 20 via a mask 71 to form a pattern. Thus, a light-emission layer is formed (FIG. 6B). This film-forming procedure is repeated. Thus, materials to form films for the hole-transport 51 and the EL emission layer 52, which function as a light-emission layer, are formed in a film-shape on the lower electrode 20 (FIG. 6C).

Figure 6D:
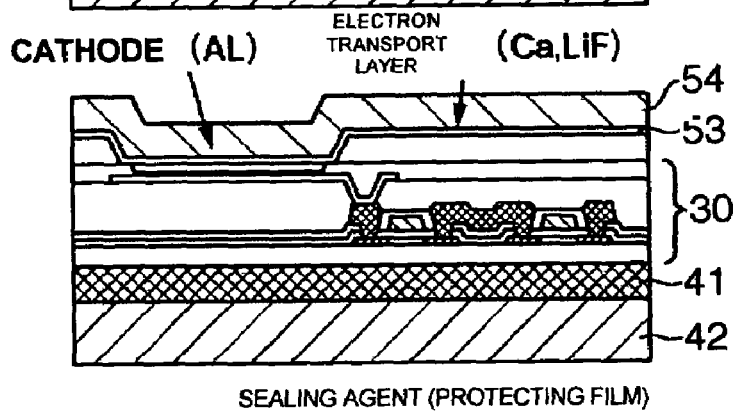
Figure 6E:
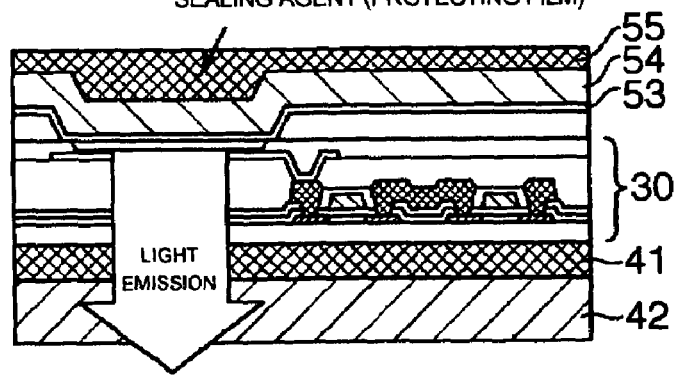

Moreover, for example, the calcium layer 53 is formed as an electron transport layer, and an aluminum layer 54 is formed in a film-shape as a cathode by sputtering, vacuum-evaporation, etc. (FIG. 6D). The sealing agent 55 is coated onto the uppermost part to form a protecting film. Thus, an organic EL display device (thin-film device) is attained (FIG. 6E).

According to the above-described production process for a thin-film circuit (organic EL display device), the mask-evaporation for which a positioning precision of not less than 5 μm is required is carried out after the thin-film circuit layer 30 is transferred onto the final transfer substrate 42. Therefore, even if a substrate with an inferior shape-stability, such as a plastic substrate, is employed, no particular problems occur in the dimensional precision of a pattern.

Fourth Exemplary Embodiment

The fourth exemplary embodiment is described below with reference to FIGS. 7A–7C. According to the fourth exemplary embodiment, for an electronic apparatus which is proposed by the present invention, printing is carried out in a process of forming a wiring through which an electric signal or an electric source is supplied from the outside. Similarly to the first exemplary embodiment, the thin-film circuit layer 30 including a fine structure is formed on the first substrate by photolithography, and is transferred onto the second substrate (see FIG. 2C).

Figure 7A:
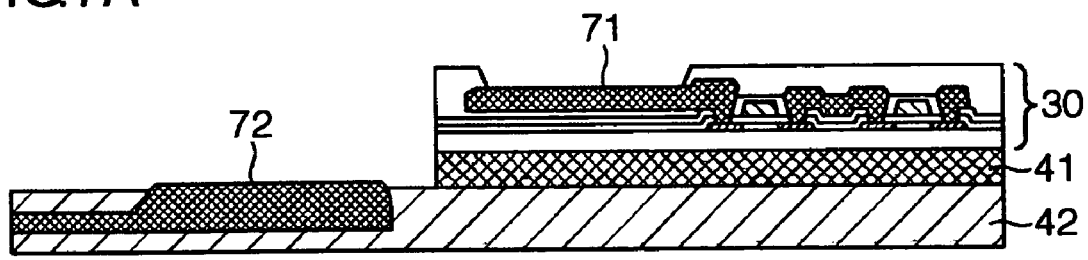
FIGS. 7A–7C are schematics illustrating a fourth exemplary embodiment.

FIG. 7A shows the cross-sectional structure of a signal/electric source introducing terminal portion 71 of the thin-film circuit layer 30 transferred on the second substrate. A terminal and a wiring 72 to connect the signal/electric source introducing terminal portion 71 of the thin-film circuit layer 30 are provided on the second substrate 11 in advance. Preferably, an example of the second substrate 11 is a flexible printed circuit board (FPC).

Figure 7B:
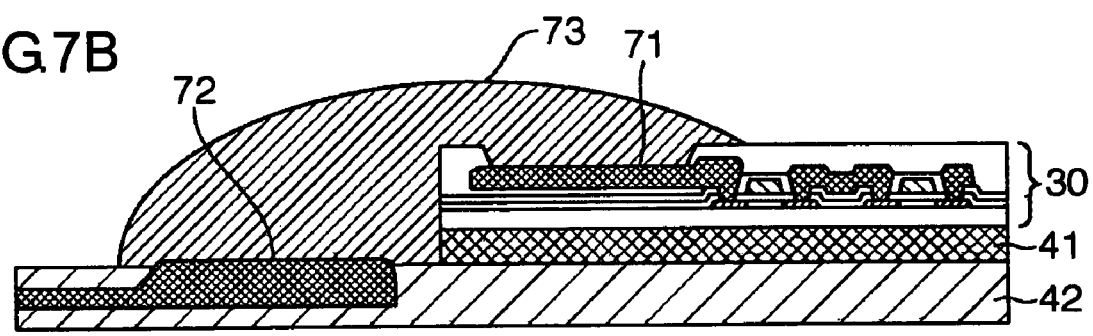

An electroconductive material 73 is printed in such a shape and size that necessary terminals among the terminal portion 71 arranged on the second substrate 42 and the thin-film circuit layer 30 are connected to each other, as shown in FIG. 7B. Preferably, an example of the electroconductive material 73 is paste of silver or the like. As a printing method, a screen printing method, flexography, an off-set printing method, a liquid-drop jetting method (ink-jet method), etc., are exemplified.

Figure 7C:
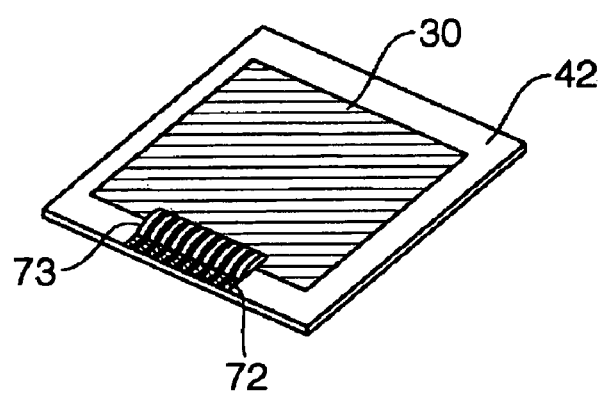

FIG. 7C is a perspective view of an electronic device produced according to this exemplary embodiment.

Fifth Exemplary Embodiment

The fifth exemplary embodiment is described below with reference to FIGS. 8A–8C. In the drawings, the elements equivalent to those in FIGS. 7A–7C are represented by the same reference numerals. The descriptions of the same elements are not repeated. According to the fifth exemplary embodiment, a bonding method is applied to positioning in a process of forming a wiring through which an electric signal or an electric power is supplied from the exterior for the electronic apparatus which is proposed according to the invention.

Similarly to the first exemplary embodiment, the thin-film circuit layer 30 including a fine structure is formed on the first substrate by photolithography, and is transferred onto the second substrate.

Figure 8A:
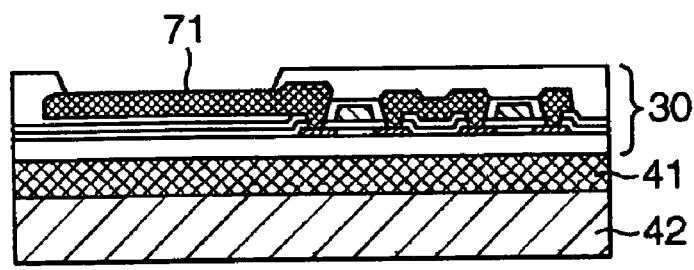
FIGS. 8A–8C are schematics illustrating a fifth exemplary embodiment.

FIG. 8A shows the cross-sectional structure of the signal/electric source introducing terminal portion 71 of the thin-film circuit layer 30 transferred on the second substrate 42.

Figure 8B:
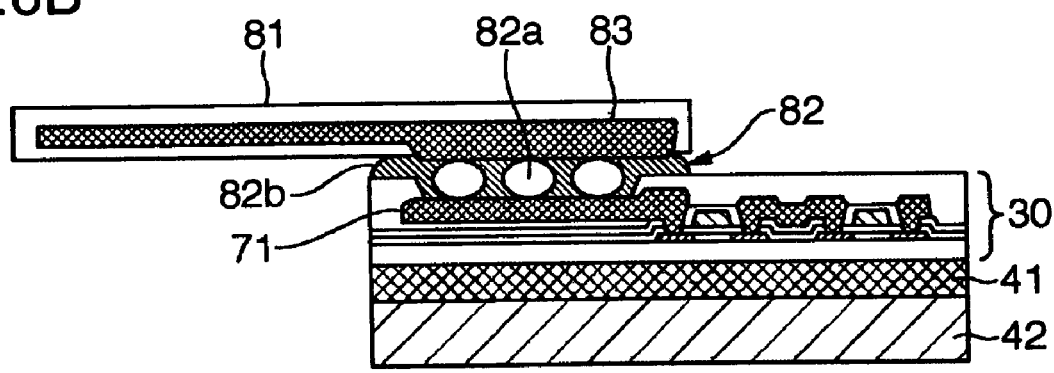

As shown in FIG. 8B, a connecting terminal portion 83 of a flexible printed-circuit substrate 81 is positioned with respect to the signal/electric source introducing terminal portion 71 of the thin-film circuit layer 30, e.g., via an anisotropic electroconductive film (ACF) 82, and is bonded thereto. The ACF 82 has a structure in which electroconductive particles with a diameter of several μm to several tens μm are dispersed in an insulating resin 82b. The film 82 is heated and pressed from the upper and lower sides. Thus, the electroconductive particles 82 come into contact with the terminal portion 71 so that the electric connection is secured, and also the insulating resin 82b is hardened so that the mechanical strength is secured.

Figure 8C:
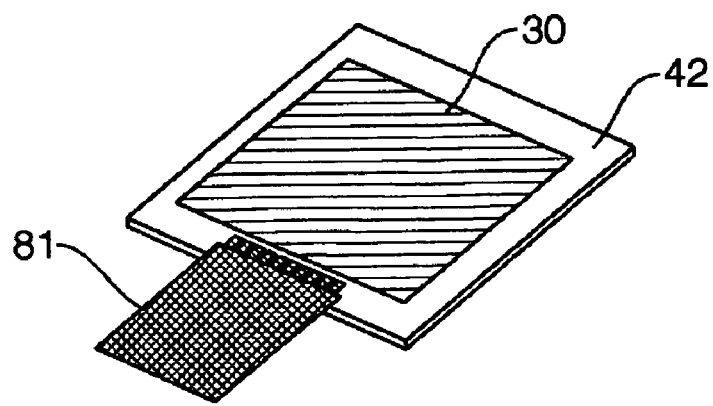

FIG. 8C is a perspective view of an electronic device which is produced according to this exemplary embodiment.

In this exemplary embodiment, the positioning precision of not less than several tens μm is sufficient for the flexible printed-circuit substrate. Thus, even if a substrate with an inferior shape-stability, such as a plastic substrate, is employed, no particular problems occur in the dimensional precision of a pattern.

In the above-described first to fifth exemplary embodiments, the temporary transfer substrate (third substrate) is used, and the thin-film circuit layer 30 is transferred or shifted onto the final substrate (second substrate) 42 in the erected state of the layer 30 on the final substrate. In the case where the thin-film circuit layer 30 can be used in the inverted state thereof on the final substrate 42, the temporary transfer process using the temporary transfer substrate (third substrate) 33 is unnecessary. In this case, the thin-film circuit layer 30 can be transferred or shifted directly from the first substrate to the second substrate.

Moreover, in the above-described first to fifth exemplary embodiments, when the thin-film circuit layer is transferred or shifted between the substrates, the substrate from which the thin-film circuit layer is to be transferred is removed by the release caused in the release layer. The substrate from which the thin-film circuit layer is to be transferred may be removed by abrasion or etching. In this case, the same advantages as described above can be obtained.

The thin-film device produced according to the production method of the present invention can be used as, for example, a display panel of a liquid crystal display device which is an electro-optical device, or as a display panel of an organic EL display device.

Figure 9:
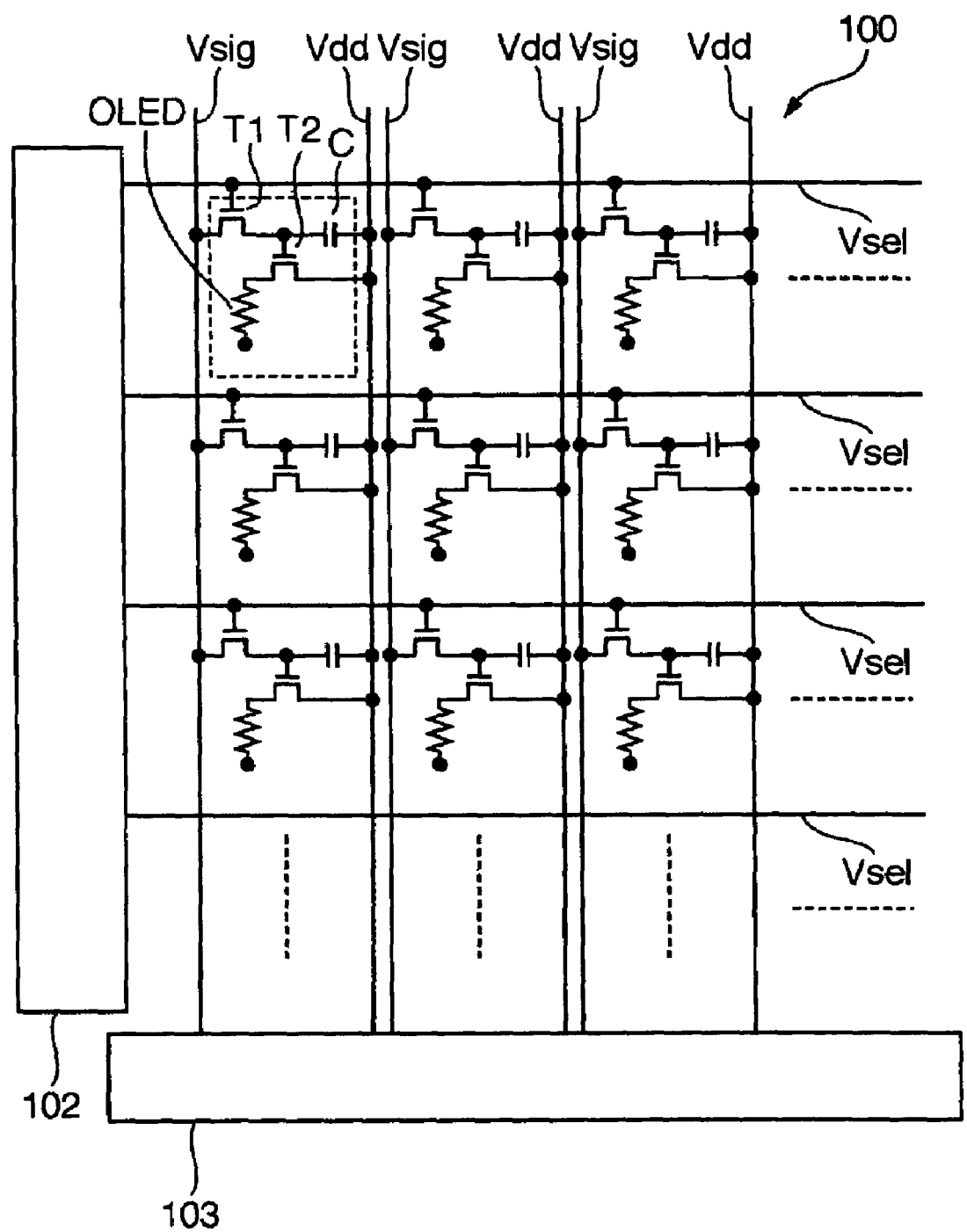
FIG. 9 is a schematic that illustrates an example of an organic EL display device (electro-optical device)

FIG. 9 shows the configuration of a circuit provided in the pixel area of an organic EL display device 100 which is driven by an active matrix system. The display panel is produced according to the production method of the present invention. Each pixel includes a light-emission layer OLED capable of emitting light according to the electroluminescence effect, a retention capacitance C for storing a current to drive the light-emission layer OLED, and thin-film transistors T1 and T2. Selection signal-lines Vsel are connected from a scanning line driver 102 to the respective pixels. Signal lines Vsig and electric source lines Vdd are connected from a data line driver 103 to the respective pixels. The current program for the respective pixel is executed by control of the selection signal lines Vsel and the signal lines Vsig. Thus, the luminescence by the light-emission portion OLED is controlled.

The thin-film device (e.g., a thin-film transistor circuit device) obtained according to the production method of the present invention can be applied for different types of electronic apparatuses having electro-optical devices.

FIGS. 10A–10F show examples of the electronic apparatus having an electro-optical device.

Figure 10A:
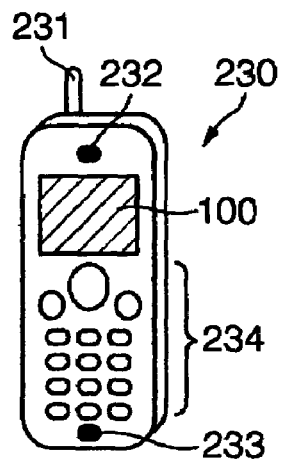
FIGS. 10A–10F are schematics that illustrate examples of an electronic apparatus provided with thin-film devices and electro-optical devices.

FIG. 10A shows a portable telephone as an application example. The portable telephone 230 includes an antenna portion 231, a speech output portion 232, a speech input portion 233, a manipulation portion 234, and a thin-film device (organic EL display device) 100 of the present invention. As described above, the thin-film device 100 of the present invention can be used as a display portion of the portable telephone 230.

Figure 10B:
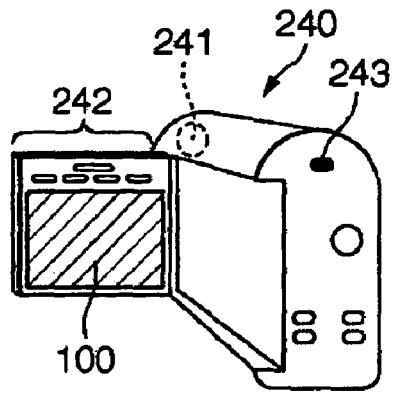

FIG. 10B shows a video camera as an application example. The video camera 240 includes an image-receiving portion 241, a manipulation portion 242, a speech input portion 243, and the thin-film device 100 of the present invention. As described above, the thin-film device 100 of the present invention can be used as a finder or a display portion.

Figure 10C:
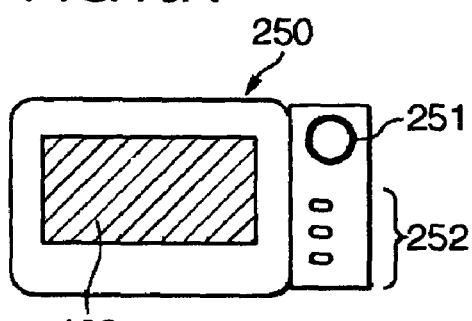
Figure 10D:
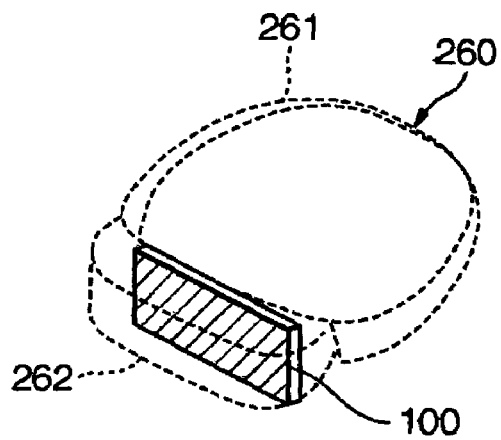

FIG. 10C shows a portable personal computer as an application example. The computer 250 includes a camera portion 251, a manipulation portion 252, and the thin-film device 100 of the present invention. As described above, the electro-optical device of the present invention can be used as a display portion.

FIG. 10B shows a head mount display as an application example. The head mount display 260 includes a band 261, an optical system containing portion 262, and the thin-film device 100 of the present invention. As described above, the electro-optical device of the present invention can be used as an image display source.

Figure 10E:
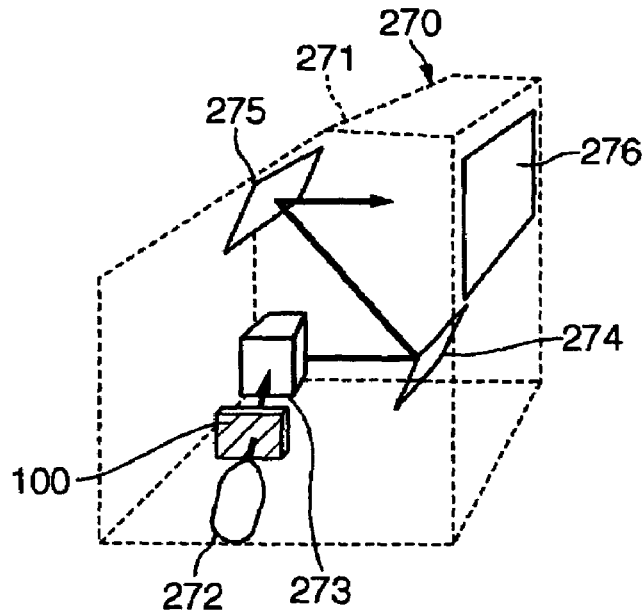

FIG. 10E shows a rear-type projector as an application example. The projector 270 includes a case 271, a light source 272, a complex optical system 273, a mirror 274, a mirror 275, a screen 276, and the thin-film device 100 of the present invention. As described above, the thin-film device of the present invention can be used as an image display source.

Figure 10F:
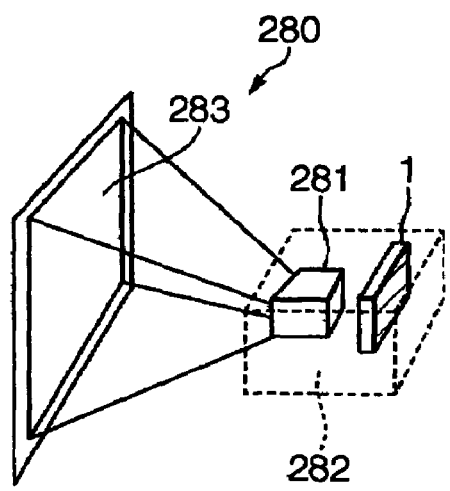

FIG. 10F shows a front type projector as an application example. The projector 280 is provided with an optical system 281 contained in a case 282, and a thin-film device 100 of the present invention. An image can be displayed on a screen 283. As described above, the thin-film device of the present invention can be used as an image display source.

The thin-film device 100 of the present invention is not restricted to the above-described examples. The tin-film device 100 can be applied for an electronic apparatus having a thin-film circuit and a fine structure, such as a facsimile with a display function, the finder of a digital camera, a portable TV, a DSP device, PDA, an electronic notebook, an electrical scoreboard, a display for advertisement, etc., for example.

As described above, according to the present invention, the required photolithographic process is carried out on the first substrate so that the fine structure or the thin-film circuit is formed. Thereafter, transferring it onto the second substrate (final transfer substrate) is conducted. Thereafter, patterning requiring a high precision is not carried out. Thus, influences of the shape-instability (dimensional instability) of the second substrate which are exerted over the manufacturing precision can be reduced.

What is claimed is:

1. A method of manufacturing an active matrix substrate, comprising:
   providing a substrate including a wiring on the substrate;
   forming a plurality of transistors and a terminal electrically connecting the transistors on the substrate; and
   disposing an electroconductive material using a non-photolithographic method such that the electroconductive material connects the wiring to the terminal.

2. The method of manufacturing an active matrix substrate according to claim 1, the substrate being a soft or flexible substrate.

3. The method of manufacturing an active matrix substrate according to claim 1, the non-photolithographic method including at least one of a liquid-droplet jetting method, a printing method, a mask-evaporation method, and a bonding method accompanied by positioning process.

4. The method of manufacturing an active matrix substrate according to claim 1, the substrate being a soft or flexible substrate.

5. The method of manufacturing an active matrix substrate according to claim 1, the non-photolithographic method being a liquid-droplet jetting method.

6. The method of manufacturing an active matrix substrate according to claim 1, the non-photolithographic method being a printing method.

7. The method of manufacturing an active matrix substrate according to claim 1, the non-photolithographic method being a mask-evaporation method.

8. The method of manufacturing an active matrix substrate according to claim 1, the non-photolithographic method being a bonding method accompanied by positioning process.

9. The method of manufacturing an active matrix substrate according to claim 1, the electroconductive material being a paste of silver.

10. A method of manufacturing an active matrix substrate, the method comprising:
    forming a plurality transistors and a terminal through which a power source voltage is supplied to the plurality of transistors, the plurality of transistors and the terminal being disposed in a circuit area of a base member on which a wiring is formed between the circuit area and an edge or edges constituting an outline of the base member;
    forming a connection between the wiring and the terminal by a non-photolithographic method.

* * * * *